United States Patent
Tomita

[19]

[11] Patent Number: 5,956,567
[45] Date of Patent: Sep. 21, 1999

[54] SEMICONDUCTOR CHIP AND SEMICONDUCTOR WAFER HAVING POWER SUPPLY PADS FOR PROBE TEST

[75] Inventor: Yasuhiro Tomita, Sanda, Japan

[73] Assignee: Matsushita Electric Industrial Co., Ltd., Osaka, Japan

[21] Appl. No.: 08/949,587

[22] Filed: Oct. 14, 1997

Related U.S. Application Data

[62] Division of application No. 08/573,669, Dec. 18, 1995, abandoned.

[30] Foreign Application Priority Data

Dec. 19, 1994 [JP] Japan .................................. 6-314486

[51] Int. Cl.$^6$ .............................. G01R 31/26; H01L 21/66
[52] U.S. Cl. .................................................................. 438/18
[58] Field of Search .......................... 438/17, 18; 257/48; 324/765

[56] References Cited

U.S. PATENT DOCUMENTS

| | | | |
|---|---|---|---|
| 3,781,683 | 12/1973 | Freed ..................................... | 324/158 F |
| 4,220,917 | 9/1980 | McMahon, Jr. ......................... | 257/773 |
| 4,586,242 | 5/1986 | Harrison ................................. | 29/574 |
| 5,059,899 | 10/1991 | Farnsworth et al. ................. | 324/158 R |
| 5,153,507 | 10/1992 | Fong et al. ............................ | 257/786 |
| 5,239,191 | 8/1993 | Sakumoto et al. . | |
| 5,285,082 | 2/1994 | Axer ........................................ | 257/48 |
| 5,365,091 | 11/1994 | Yamagishi ............................... | 257/203 |
| 5,473,196 | 12/1995 | DeGivry .................................. | 257/786 |
| 5,475,236 | 12/1995 | Yoshizaki ................................ | 257/48 |
| 5,504,369 | 4/1996 | Dasse et al. ............................ | 257/620 |

FOREIGN PATENT DOCUMENTS

| | | |
|---|---|---|
| 54-81077 | 6/1979 | Japan . |
| 59-61056 | 4/1984 | Japan . |
| 60-83344 | 5/1985 | Japan . |
| 62-145764 | 6/1987 | Japan . |
| 62-163336 | 7/1987 | Japan . |
| 63-310155 | 12/1988 | Japan . |
| 1-286414 | 11/1989 | Japan . |
| 2-211648 | 8/1990 | Japan . |
| 2-309656 | 12/1990 | Japan . |
| 4-186647 | 7/1992 | Japan . |
| 6-21174 | 1/1994 | Japan . |
| 6-61298 | 3/1994 | Japan . |
| 1991011453 | 2/1992 | Rep. of Korea . |

*Primary Examiner*—Brian Dutton
*Attorney, Agent, or Firm*—Ratner & Prestia

[57] ABSTRACT

A semiconductor chip having an internal circuit providing a prescribed function is provided. The semiconductor chip includes: a signal pad to be used for input and/or output of a signal to and/or from the internal circuit; a first power supply pad to be used for supplying electric power to the internal circuit both in a mounted condition and in an operational test with a probe; and a second power supply pad to be used for supplying electric power to the internal circuit in the operational test with the probe.

21 Claims, 10 Drawing Sheets

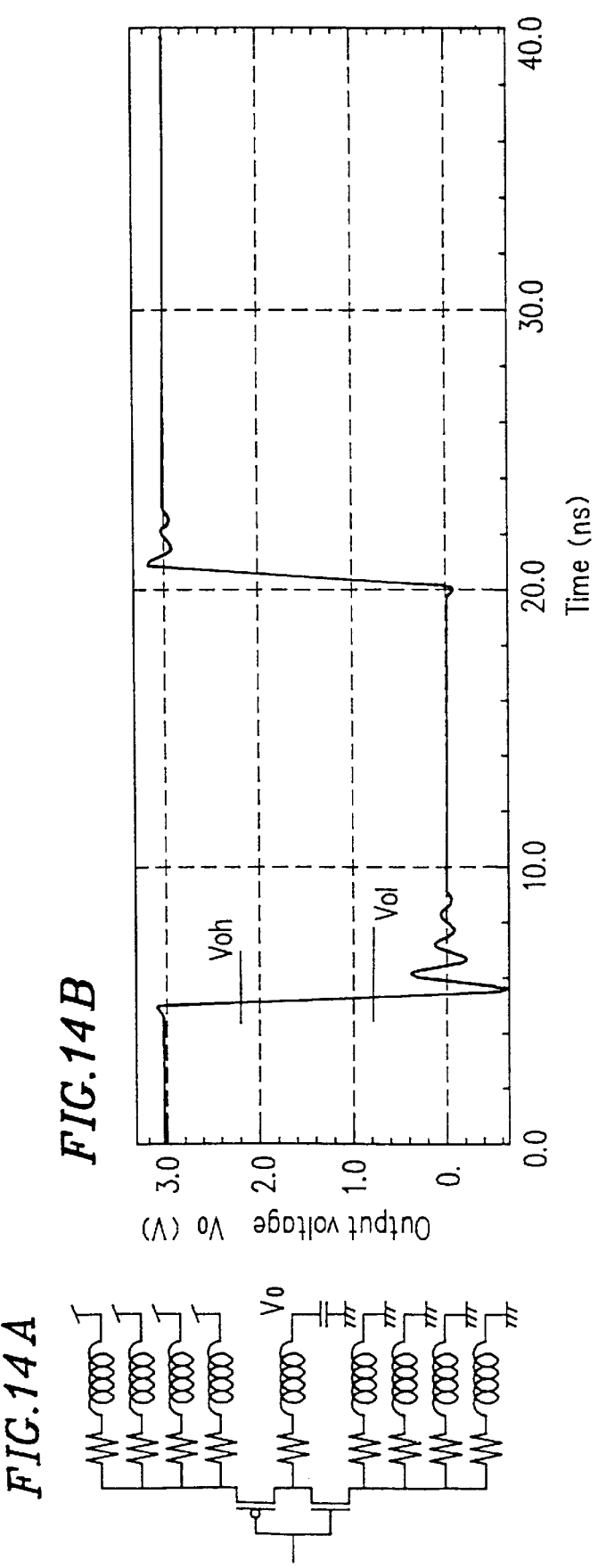

SEMICONDUCTOR CHIP AND SEMICONDUCTOR WAFER HAVING POWER SUPPLY PADS FOR PROBE TEST

This application is a division of application Ser. No. 08/573,669, filed Dec. 18, 1995, now abandoned.

BACKGROUND OF THE INVENTION

1. Field of the Invention

The present invention relates to a semiconductor chip and a semiconductor wafer having power supply pads for a probe test.

2. Description of the Related Art

FIG. 1 is a flow chart illustrating a flow for a typical semiconductor chip testing to be performed to check whether the semiconductor chip operates correctly (such a test is also called as a "device testing").

In a normal test of a semiconductor chip, an operational test 20 (referred to as "a wafer test" hereinafter) for a semiconductor chip sample in a wafer state is first performed and, then, a first judgment step 30 is performed based on a result thereof. A sample judged not to have specified functions is judged as a reject or a failed sample 80 and excluded from further tests conducted later.

Next a packaging step 40 where the sample which passed the judgment step 30 based on the wafer test 20 is performed and, then, an operational test 50 (referred to as "a package test" hereinafter) for the sample in a package state is conducted. Then a second judgment step 60 is conducted based on a result thereof, thereby selecting a final good sample 70.

In the wafer test 20 mentioned above, a needle probe (hereinafter, it may be simply referred to as the "probe") is generally brought into contact with a pad formed on the semiconductor chip to apply test signals or to supply power. The operation of a circuit in response to the applied signal is then measured so as to judge whether the circuit works correctly or not. An operational test utilizing those needle probes mentioned above are referred to as "a probe test".

Accompanied by recent capability of fabricating a submicron configuration in a large scale integration in manufacturing processes of semiconductor chips, manufacture of a submicron, large scale and high speed high pin count chip is becoming possible, which operates faster, has higher functions, and is equipped with more signal pins than a conventional one.

In an operation of such a high speed high pin count chip, potentials at a number of signal pins vary simultaneously at high rate of speed and, therefore, a peak value of current flowing during operation becomes large. A large peak current causes noises in a signal line and/or a power source, resulting in adverse effects on measurement results at the probe test.

On the other hand, when the size of a semiconductor chip becomes large, the length of the wiring which is required during the probe test necessarily gets long. However, such increase in the wiring length, particularly the increase in the power supply wiring length, increases the impedance of the wiring, that is, the resistance component R or the self-inductance component L. Of these, the increase in the resistance component R brings about the occurrence of undesired Joule heating as well as decrease in the voltage supplied from a power source. On the other hand, the increase in the self-inductance component L of the wiring makes the high speed operation of a circuit difficult, resulting in hindering the reduction of time necessary for the probe test, for the following reason.

When a number of signal output pins simultaneously make transition from a high level output to a low level output, or from the low level output to the high level output, a large current flows into a grounding line of a semiconductor chip at the moment of the transition, and the potential of the grounding line rises. Due to this momentary current change (di/dt) and the self-inductance component L of the wiring, an induced voltage component which is determined as $-L \cdot (di/dt)$ occurs in the wiring and the voltage level fluctuates. This phenomenon is known as the ground bounce phenomenon.

FIG. 12B shows an exemplary waveform observed in a circuit shown in FIG. 12A, including a voltage fluctuation caused by the ground bounce phenomenon. When a potential at an output pin changes from a high level (3V) to a low level (0V), or from the low level (0V) to the high level (3V), a voltage fluctuation appears in an output voltage waveform Vo due to the ground bounce phenomenon as explained above. At this time, an input threshold level fluctuates at an input pin. Furthermore, at an output pin at which a output potential of a constant level is supposed to be maintained by being kept supplied with a constant input potential, a fluctuation is observed in the constant output voltage.

For example, FIG. 12C shows a voltage fluctuation observed at an output pin at which a potential of a constant low level (for example, at 0 V) is output in response to an input voltage of a high level (for example, at 3 V). FIG. 12D, on the other hand, shows a voltage fluctuation observed at an output pin at which a potential of a constant high level (3V) is output in response to an input voltage of a low level (0V). These voltage fluctuations in the output voltage are observed as ringing.

A logic value from an output of a circuit on the semiconductor chip during a period of the occurrence of the ground bounce phenomenon is an error-including output value in a sense that the voltage level thereof includes a fluctuating voltage component due to the ground bounce phenomenon. Therefore, it is necessary to wait to make sampling of a logic value to be output until the ground bounce phenomenon subsides and the voltage level of the output signal returns to a normal value. As a result, high speed operation of the semiconductor chip is hindered.

A needle probe used in a probe test of a semiconductor chip is made of metals such as, for example, tungsten, and has a needle-like shape. However, in a case that the wafer test 20 is conducted using a conventional needle probe made of tungsten, the length of the wiring connected for the test becomes longer compared to the case of the package test 50. As a result, the wiring impedance becomes large and the adverse effect of the above mentioned ground bounce phenomenon largely appears. In order to avoid the influence thereof, it is necessary to sufficiently reduce the test frequency in the wafer test 20 compared to the package test 50, and this poses a problem in view of the efficiency of the test. In other words, in the conventional technique, it is difficult to conduct a test at the maximum operation frequency of the semiconductor chip in the wafer test 20.

In order to solve this problem, it has been attempted to reduce the wiring impedance in the wafer test 20 to as low as the wiring impedance in the package test 50 by sufficiently reducing the impedance of the needle probe used in the test.

The simplest solution is to reduce a resistance component and an inductance component by modifying the shape of the needle probe, for example, with providing an increased cross-section thereof. However, a needle probe having such a large cross-section is disadvantageous in a case where the circuit formed in a semiconductor chip becomes highly integrated and a number of pads are densely formed within a small area. Therefore, this solution is not very effective in view of practicality.

As another solution, the use of a membrane probe card instead of a conventional metal needle probe can be cited. The membrane probe is such that a wiring pattern made of materials such as copper, nickel, gold or the like is formed on a thin insulative base member made of materials such as polyimide, glass epoxy, or the like, and a bump made of copper, gold, solder or the like is provided at the tip portion of the wiring pattern so as to be used as a probe. However, the cost of manufacturing the membrane probe card is much higher compared to the conventional tungsten needle probe and it cannot be perceived as having sufficient practicality.

In regard to those points mentioned above, concerning an operational test of a semiconductor chip, it is not possible in any conventional technique to confirm in the wafer test 20, for example, whether or not the operation of the semiconductor chip is normal at the prescribed maximum operation frequency by raising the test frequency, but it is done in the package test 50 which is conducted after the semiconductor chip is mounted on a package through the packaging step 40. Although a semiconductor chip which does not exhibit a prescribed function at the prescribed maximum operation frequency is ultimately rejected as a failed sample, those semiconductor chips which are unsatisfactory in terms of operation speed and to be ultimately rejected as a failed sample could be mounted on the package since it is difficult to conduct a test for such rejection in the wafer test as mentioned above. This introduces a reduction in the efficiency of the operational test and, moreover, a rise in the total manufacturing cost of the semiconductor chips.

Furthermore, recently in response to the need for miniaturizing a variety of electric-electronic devices including semiconductor chips, there has been a growing number of examples of usage differing from a conventional example in which one semiconductor chip is mounted on a package. One of them is an example in which a bare chip cut out of a semiconductor wafer with no further processing is directly mounted on a print circuit board included in an electronic-electrical device without mounting on a package. Alternatively, examples of adopting a multi-chip module (MCM) in which a plurality of semiconductor chips (bare chips) are mounted on a package with wiring substrate are increasing.

Under these circumstances, it is becoming necessary for a semiconductor manufacturer to sort good samples from failed samples by conducting an operational test ("at speed test") on a bare chip at the maximum operation frequency in order to ensure the performance of semiconductor chips to be supplied. In the MCM, when one of a plurality of bare chips which are put in a package is a failed sample, the MCM itself becomes a failed sample which does not function normally, thereby resulting in a reduction of the production yield. Therefore, not only in a case where the bare chip is used without mounting on a package but also in a case of the MCM, it is necessary to conduct a probe test at a high frequency efficiently and with low cost on a semiconductor chip or a bare chip in a wafer state.

SUMMARY OF THE INVENTION

According to one aspect of the invention, a semiconductor chip, having an internal circuit providing a prescribed function, includes: a signal pad to be used for input and/or output of a signal to and/or from the internal circuit; a first power supply pad to be used for supplying electric power to the internal circuit both in a mounted condition and in an operational test with a probe; and a second power supply pad to be used for supplying electric power to the internal circuit in the operational test with the probe.

In one embodiment, the second power supply pad is electrically connected with the first power supply pad, and a power supply is connected to the internal circuit in parallel in the operational test with the probe.

In another embodiment, the semiconductor chip includes an internal circuit region where the internal circuit is provided therein and a pad region where the signal pad and the first power supply pad are provided therein, wherein at least one of the second power supply pad is provided in the pad region. Alternatively, the semiconductor chip includes an internal circuit region where the internal circuit is provided therein and a pad region where the signal pad and the first power supply pad are provided therein, wherein at least one of the second power supply pad is provided in the internal circuit region.

In still another embodiment, the semiconductor chip is packaged and mounted.

According to the invention, a printed circuit board wherein the semiconductor chip as mentioned above is mounted as a bare chip is provided. Furthermore, according to the invention, a multi-chip module wherein a plurality of the semiconductor chips as mentioned above are mounted is provided.

According to another aspect of the invention, a semiconductor wafer includes a plurality of chip regions, in which a semiconductor chip having an internal circuit providing a prescribed function is formed, and a scribe line region to be used for dicing the semiconductor wafer so as to separate the plurality of the chip regions from each other, and the semiconductor chip formed in each of the chip regions includes: a signal pad to be used for input and/or output of a signal to and/or from the internal circuit; and a first power supply pad to be used for supplying electric power to the internal circuit both in a mounted condition and in an operational test with a probe, wherein the semiconductor wafer further comprises a second power supply pad to be used for supplying electric power to the internal circuit in the operational test with the probe, the second power supply pad being provided in the scribe line region.

In one embodiment, the second power supply pad provided in the scribe line region Is arranged in one line. In another embodiment, the second power supply pad provided in the scribe line region is arranged in multiple lines. In still another embodiment, the second power supply pad provided in the scribe line region is arranged in a staggered manner.

In still another embodiment, the second power supply pad is further provided in the chip region.

In still another embodiment, the second power supply pad is electrically connected with the first power supply pad, and a power supply is connected to the internal circuit in parallel in the operational test with the probe.

According to still another aspect of the invention, a method for checking an operation of a semiconductor chip which includes an internal circuit providing a prescribed function, a signal pad to be used for input and/or output of a signal to and/or from the internal circuit and a first power supply pad to be used for supplying electric power to the internal circuit both in a mounted condition and in an operational test with a probe is provided. The method includes the steps of: forming at least one second power supply pad to be used for supplying electric power to the internal circuit in the operational test with the probe in the scribe line region on a surface of the semiconductor wafer, while forming a pattern of the semiconductor chip; checking whether the semiconductor chip provides a prescribed function or not; and cutting the respective semiconductor chips from the semiconductor wafer along the scribe line region and removing the second power supply pad provided in the scribe line region.

Thus, the invention described herein makes possible the advantage of providing a semiconductor chip and a semiconductor wafer having power supply pads for a probe test, the power supply pad making it possible to suppress the influence of the power supply noise and to efficiently conduct a test at the maximum operational frequency ("at speed test") with low cost in an operational test using a needle probe on a semiconductor chip in a wafer state, that is, a probe test.

This and other advantages of the present invention will become apparent to those skilled in the art upon reading and understanding the following detailed description with reference to the accompanying figures.

BRIEF DESCRIPTION OF THE DRAWINGS

FIG. 14A shows one example of a circuit configuration of output pad which is connected to a power source and a grounding line with four probes; and FIG. 14B shows a simulated waveform illustrating a voltage fluctuation caused by the ground bounce phenomenon in the circuit shown in FIG. 14A.

DESCRIPTION OF THE PREFERRED EMBODIMENTS

Figure 1:
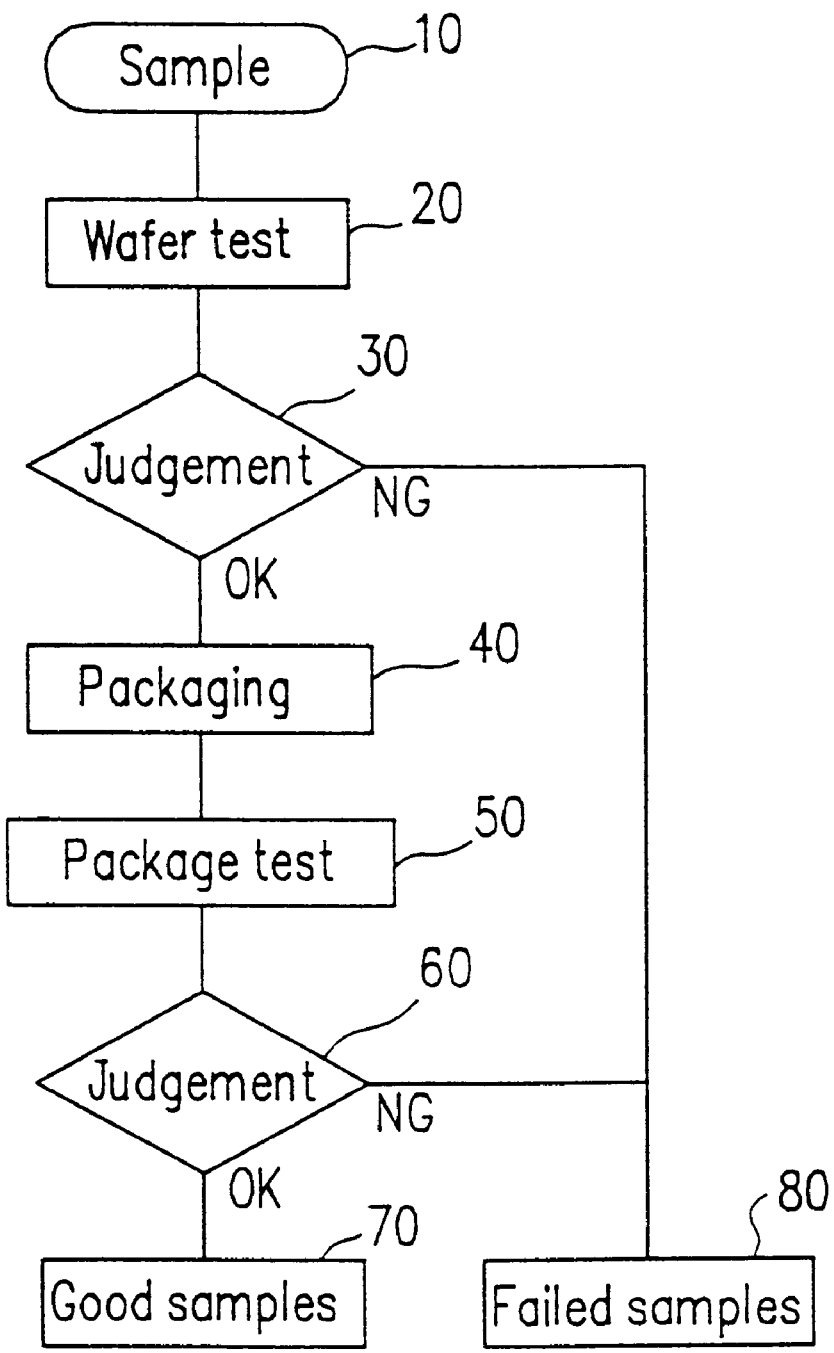
FIG. 1 is a flow chart of a typical semiconductor chip testing.

According to the structure of the present invention, as a power supply pad used to connect a power supply to a semiconductor chip to be tested in a wafer test (the probe test) which checks the operation of the semiconductor chips included in the semiconductor wafer, in addition to a first group of power supply pads which are also used in a final product where a semiconductor chip is mounted on a package, a second group of power supply pads which are used only during a probe test are provided. As a result, a plurality of needle probes are connected in parallel between the power supply and the first and the second groups of power supply pads during the probe test. Resistances of the needle probes, which are obtained as the sum of a resistance of the needle probe and a contact resistance between the probe and the power supply pad, are thereby connected in parallel with each other, resulting in the decrease of the resistances. Moreover, since a plurality of needle probes are densely positioned, the self-inductance of each needle probe decreases. As a result, the power supply impedance during the probe test is reduced.

Furthermore, since the number of needle probes to be used increases, current flowing through one needle probe decreases and, consequently, a time rate of change of the current becomes small. As a result, the occurrence of the ground bounce phenomenon is suppressed and noises derived from the power supply which occurs during the probe test are reduced. Moreover, since the ground bounce phenomenon is suppressed, the time interval during which a logic value including an error is being output is shortened, and the test frequency at an operation test on the semiconductor chip in a wafer state can be raised.

Furthermore, since the second group of power supply pads to be used only at the probe test are separately provided from the first group of power supply pads to be needed also in a final product, the number of the power supply pads included in the semiconductor chip when mounting on a package is kept to the minimum number fitted to mounting conditions of the package. As a result, the increase in the size of the package (the number of pins) is suppressed and production at low cost is accomplished.

Furthermore, it is not necessary to connect bonding wires to the second group of power supply pads which are used only during the probe test in contrast to the first group of power supply pads which are also used in a final product mounted on the package. For this reason, there is no restriction on the location of the second group of power supply pads with respect of a wire bonding step, and the degree of freedom for their distribution is high. Therefore, the second group of power supply pads for the probe test can be provided by effectively utilizing open regions on the semiconductor chip. This makes a high speed operation of the semiconductor chip possible at the probe test on the semiconductor wafer while suppressing the increase of the chip area as much as possible, and the improvement of the operational test efficiency at low cost can be realized.

Furthermore, in a region where a plurality of needle probes are densely connected to the pads, not only the needle probes connected to the power supply pads but also the needle probes connected to signal pads reduce their self-inductance, and wiring impedance is matched with impedance of a transmission line. As a result, the ringing of the signal to be obtained is reduced, and the high speed operation of the semiconductor chip which is subjected to the operational test becomes possible, thereby improving the efficiency of the operational test.

Furthermore, the second group of power supply pads used only during a probe test mentioned above can be formed in a scribe line region which is required when individual semiconductor chips are cut out of a semiconductor wafer. In this case, the second group of power supply pads for the probe test are simultaneously ground away together with the scribe line region when cutting semiconductor chips from the wafer. Therefore, by forming the second group of power supply pads for the probe test on the scribe line region, the high speed operation of the semiconductor chip at the probe test on the semiconductor wafer becomes possible without increasing the area of the chip. In this case, since the chip area does not increase, the aforementioned objective of the present invention can be achieved at the lowest cost. The second group of power suplly pads can be provided in the scribe line such that pads for grounding the circuit are used commonly for the adjacent semiconductor chips.

Hereinafter, embodiments of the present invention will be described with reference to figures.

EXAMPLE 1

Figure 2:
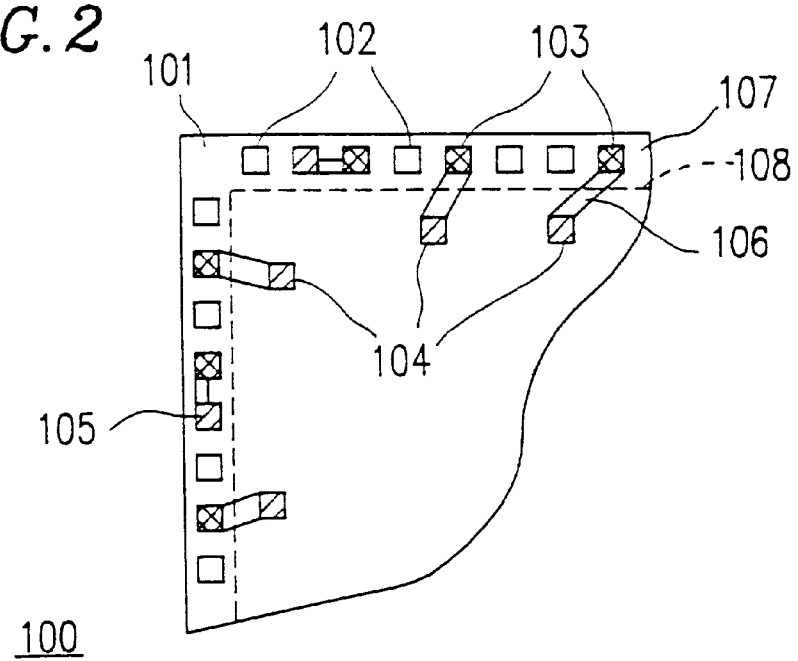
FIG. 2 is a partial plan view illustrating a semiconductor chip having power supply pads for a probe test according to a first embodiment of the present invention.

FIG. 2 is a partial plan view illustrating a semiconductor chip 100 having power supply pads for a probe test according to the first embodiment of the present invention. It should be noted that, in FIG. 2 and like drawings, only a portion of the whole semiconductor chip 100 (around one corner thereof) is illustrated.

The semiconductor chip 100 includes on a semiconductor substrate 101 signal pads 102 to be used for signal transmission between a circuit included in the semiconductor chip 100 (referred to as "an internal circuit" hereinafter) and a circuit outside of the semiconductor chip 100 (referred to as "an external circuit" hereinafter), as well as power supply pads 103, 104, and 105 to be used to supply power to the internal circuit from an external power supply. In the drawings, wiring connecting the respective pads and the internal circuit are omitted for simplification.

The power supply pads which are designated by reference numeral 103 are the power supply pads to be used also in a final product. On the other hand, the power supply pads which are designated by reference numerals 104 and 105 are the additional pads to be used only during the probe test. In the probe test, the power is supplied to the internal circuit from the power supply through the power supply pads 104 and 105 in addition to the power supply pads 103. The power supply pads 103 and 104 and the power supply pads 103 and 105 are connected with each other by a wiring 106, respectively. Thus, a power supply is connected in parallel to the internal circuit which is included in the semiconductor chip 100.

Of the power supply pads 104 and 105 which are provided for the probe test, the power supply pads 105 are positioned in vacant regions within the same region 107 (hereinafter, referred to as the "pad region") of the signal pads 102 or the power supply pads 103 along the sides of the semiconductor chip 100. On the other hand, the power supply pads 104 are provided in vacant regions within the region 108 (hereinafter referred to as "internal circuit region") where the internal circuit is provided. Therefore, the power supply pads 104 are positioned far inside from the sides of the semiconductor chip 100 compared to the signal pads 102 or the power supply pads 103 and 105.

Before the semiconductor chip 100 is packaged, the degree of freedom of the distribution of the power supply pads is large. Since there is no need that the power supply pads 104 and 105 for the probe test be connected to bonding wires to be described later, they can be positioned in arbitrary vacant regions in the semiconductor chip 100, including the internal circuit region 108. The power supply pads 104 and 105 can be formed in the same process as the signal pad 102, the power supply pad 103, and the pattern of the internal circuit.

Figure 3:
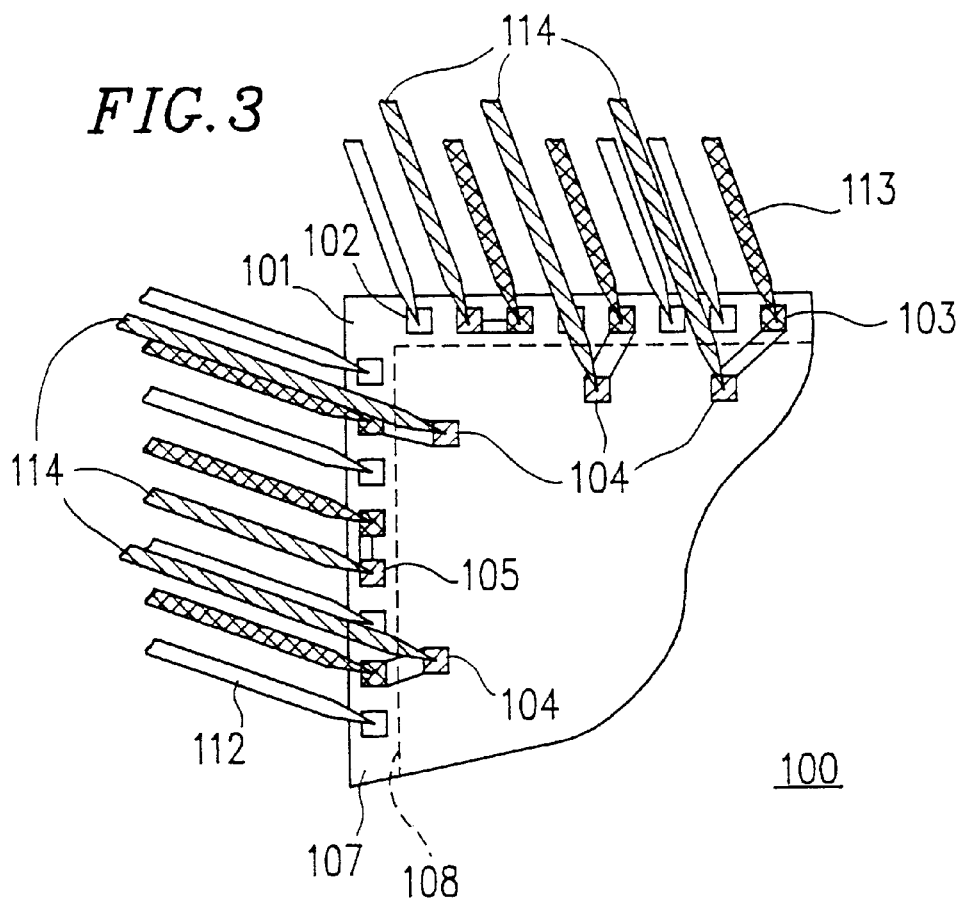
FIG. 3 is a plan view schematically illustrating a contact state of needle probes to the semiconductor chip of the present invention illustrated in FIG. 2.
Figure 4:
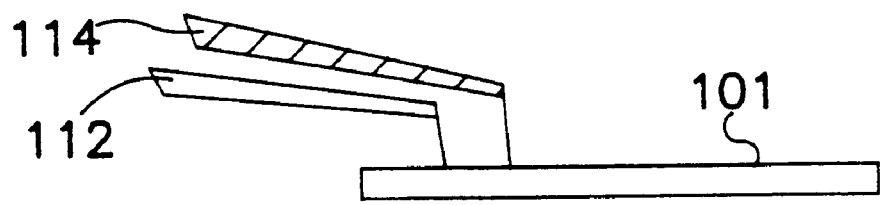
FIG. 4 is a cross-sectional view schematically illustrating a contact state of needle probes to the semiconductor chip of the present invention illustrated in FIG. 2.

FIGS. 3 and 4 illustrate a state in which probes 112 through 114 are touching the semiconductor chip 100 during the probe test.

Specifically, the needle probe 112 contacts the signal pad 102 and carries out a signal transmission. The needle probe 113 contacts the power supply pad 103 and supplies power from the power supply. Furthermore, the needle probe 114 contacts the power supply pads 104 and 105 and also supplies power from the power supply. Since the needle probes are three-dimensionally positioned, the degree of freedom of their positioning is large. The needle probe 114 also contacts the power supply pad 104 for the test provided in the internal circuit region 108 of the semiconductor chip 100 both easily and firmly as illustrated in FIG. 4. Therefore, the additional power supply pads 104 and 105 for the probe test can be provided at an arbitrary location in vacant regions included in the semiconductor chip 100 such that the area of the semiconductor chip 100 does not increase or the increase thereof becomes the minimum.

The needle probes 112 through 114 are typically made of tungsten and their length is typically several cm. The tungsten probe of such length typically has a resistance value of several $\Omega$ and a self-inductance of several tens of nH. Moreover, a contact area between the pad provided on a semiconductor substrate 101 and the tungsten needle probe is typically several tens of $\mu m^2$, and there exits a contact resistance in a range of about several tens of m$\Omega$ to about several $\Omega$. However, since the power supply pads 104 and 105 for the probe test are provided on the semiconductor substrate 101 in addition to the usual signal pads 102 and the power supply pads 103 in the semiconductor chip 100 of the present invention, the additional probes 114 are used to make connection with these additional power supply pads 104 and 105. This makes the needle probes 112 through 114 densely positioned compared to the case of a probe test on the semiconductor chip in the conventional technique, thereby resulting in the reduction of the self-inductance which the needle probes 112 through 114 have.

Figure 5:
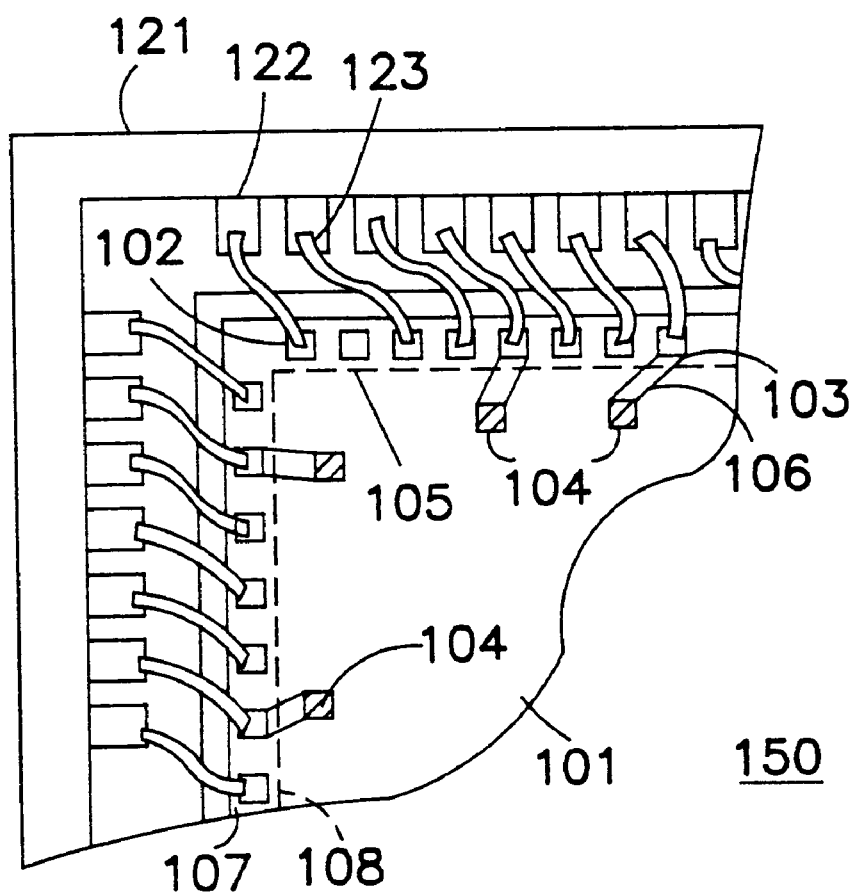
FIG. 5 is a partial plan view illustrating the semiconductor chip of the present invention illustrated in FIG. 2 in a state in which it is mounted on a package.

FIG. 5 is a plan view schematically illustrating a chip 150 in which the semiconductor chip 100 is separated from the semiconductor wafer into a piece and mounted on the package 121 after the probe test is over.

Of the pads provided on the surface of the semiconductor substrate 101, the signal pads 102 and the power supply pads 103 are connected to package pads 122 provided on the package 121 by bonding wires 123. On the other hand, wire bonding connections are not provided to the power supply pads 104 and 105 for the probe test. Although the bonding wire 123 is normally of a length of several hundreds of μm and possesses several tens nH of self-inductance, this self-inductance value is sufficiently small compared to the self-inductance of the needle probe.

Figure 6:
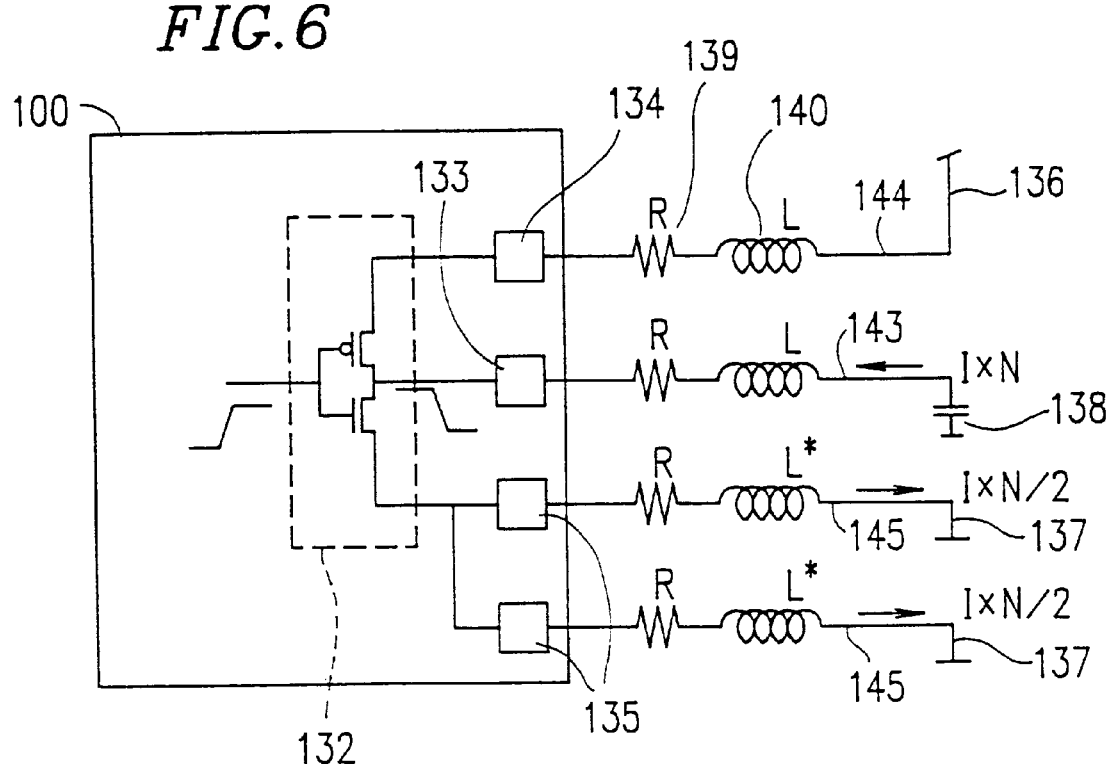
FIG. 6 is a diagram illustrating an equivalent circuit of the measurement circuit during the probe test on the semiconductor chip of the present invention.

FIG. 6 shows an equivalent circuit of a measurement circuit constituted of the semiconductor chip and the probes during the probe test.

In the equivalent circuit, the needle probes 143 through 145 are respectively expressed by a wiring resistance 139 and a wiring inductance 140. A pad driver 132 is provided on the semiconductor chip 100 and drives the signal pad 133. The pad driver 132 is connected to the power supply line 136 through the needle probe 144 and the power supply pad 134, so as to receive the supply of power, and, at the same time, connected to the grounding line 137 through the power supply pads 135 and the needle probes 145. As illustrated in FIG. 6, two pairs of the power supply pad 135 and the needle probe 145 are connected in parallel between the pad driver 132 and the grounding line 137.

Here, a case in which the pad output driver 132 makes a transition from a high level output to a low level output is considered. Discharge current I×N of an output load capacitor 138 flows into the pad driver 132 through the needle probe 143 and the signal pad 133. The inflowing current then flows out to the grounding line 137 from the power supply pad 135 through the needle probe 145. (More specifically, a penetration current from the power supply line 136 to the grounding line 137 also flows while the input signal to the pad driver 132 is in a transition condition.) Due to this current flow, the ground bounce phenomenon occurs, and the potential at the power supply pad 135 experiences fluctuation which is determined by the magnitude of the inflowing current, its time rate of change, and the magnitude of the impedance of the needle probe 145.

However, in the semiconductor chip 100 of the present invention, two pairs of the power supply pad 135 and the needle probe 145 are connected in parallel between the pad driver 132 and the grounding line 137. Therefore, the impedance of each needle probe 145 becomes ½ of what it would be if there were only one needle probe. Moreover, current flowing through one needle probe 145 becomes ½ (that is, I×N/2) of what it would be (I×N) if there were only one needle probe. Furthermore, since a plurality of the needle probes 145 are densely positioned, the self-inductance $L^*$ of each of the needle probes 145 takes a smaller value than L which is the value of the self-inductance of one needle probe in a case where it stands alone (i.e., $L^* < L$).

When a change in the amount of the current flowing through the equivalent circuit in FIG. 6 occurs, an induced voltage $-L \cdot (dI/dt)$ determined by a product of the self-inductance L of the needle probe and the time rate of change of the current occurs. When this occurs, however, the value of the induced voltage occurring is reduced in the semiconductor chip 100 of the present invention, since the self-inductance value of the needle probe or the peak value of the current flowing through the needle probe is reduced compared to the conventional one.

Furthermore, in a high pin count device which operates at a high speed, not only the peak value of the current is large but the time rate of change thereof is also large. Consequently, by connecting a plurality of needle probes in parallel at the power supply pads according to the present invention so that the power supply is connected to the internal circuit in parallel, a substantial noise reduction effect can be obtained.

With reference to FIGS. 13A, 13B, 14A and 14B, the simulation results illustrative of suppressing the ground bounce phenomenon according to the invention are explained.

Figure 13A:
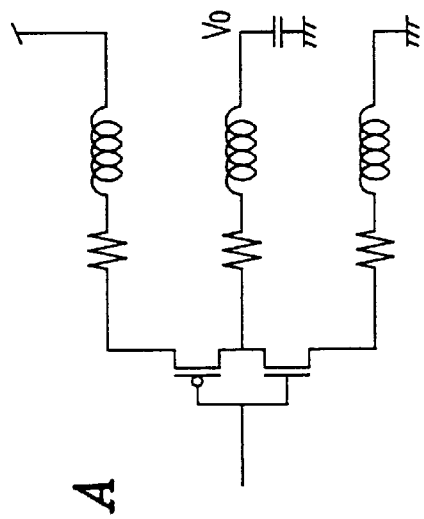
FIG. 13A shows one example of a circuit configuration of output pad which is connected to a power source and a grounding line with one probe.
Figure 13B:
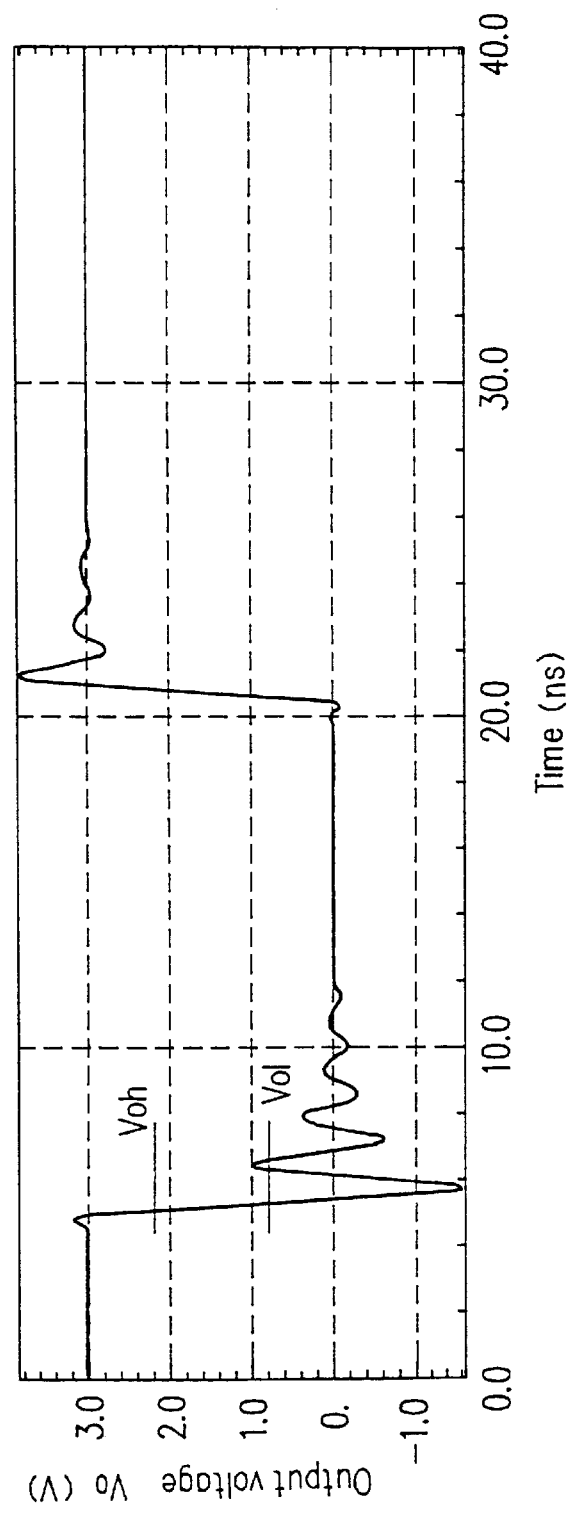
FIG. 13B shows a simulated waveform illustrating a voltage fluctuation caused by the ground bounce phenomenon in the circuit shown in FIG. 13A.

In a case where a circuit is connected to a power supply and a grounding line with one needle probe as shown in FIG. 13A, a large fluctuation appears in an output voltage waveform due to an induced voltage described above when the output voltage changes between a low level and a high level as shown in FIG. 13B. This fluctuation is sometimes large enough to be beyond a judging level $V_{ol}$ for the low level and/or a judging level $V_{oh}$ for the high level.

When the output voltage surpasses these judging levels, a false output is output from the circuit, resulting in an error in the circuit operation. In order to avoid such an error, a level judgement for the output voltage has to be conducted after the fluctuation in the output voltage becomes sufficiently small. In a circuit which operates at a high frequency (a high speed), however, the period of time from a change of the output voltage level to the level judgment has to be shortened. As a result, an error of the circuit operation in connection with the ground bounce phenomenon tends to easily occur.

On the other hand, in a case where a circuit is connected to a power supply and a grounding line with a plurality of needle probes as shown in FIG. 14A (with four probes in this case), a fluctuation in an output voltage waveform due to an induced voltage is sufficiently suppressed as shown in FIG. 14B. Thus, an error in the circuit operation in connection with the ground bounce phenomenon does not occur even when the period of time from a change of the output voltage level to the level judgment is shortened in a circuit which operates at a high frequency (a high speed).

As described above, according to the present invention, when conducting the probe test on the semiconductor chip in a wafer state, that is, the wafer test, the power supply pads which are used only during the probe test are provided in the semiconductor chip in addition to the power supply pads which are used also in a final product. This reduces the impedance of the measurement wiring as well as the ringing which occurs in a measured signal during the probe test, and the test frequency at the operation test of the semiconductor chip in a wafer state can be raised. As a result, it becomes possible to check whether the semiconductor chip works any desired function normally at a prescribed maximum operational speed (frequency). Thus, the final selection of good samples of the semiconductor chips can be made in a wafer state. As a result, it becomes possible to make the probe test on the semiconductor chip included in the semiconductor wafer efficient.

In the above description, it has been explained that the semiconductor chip of the present invention is packaged with wire bonding connections after the probe test is over, with reference to FIG. 5. Alternatively, the semiconductor chip of the present invention can be mounted in different ways. For example, a bare chip which is separated from a wafer can be mounted directly on a substrate with, for example, flip chip mounting, so as to form a module. Moreover, a plurality of bare chips can be mounted inside a single module so as to obtain an MCM (multi-chip module). In any case, only good sample exhibiting a desired function can be selected to form a final product, since the final stage of operation tests has been already done with the wafer. Thus, production yield increases.

EXAMPLE 2

Figure 7:
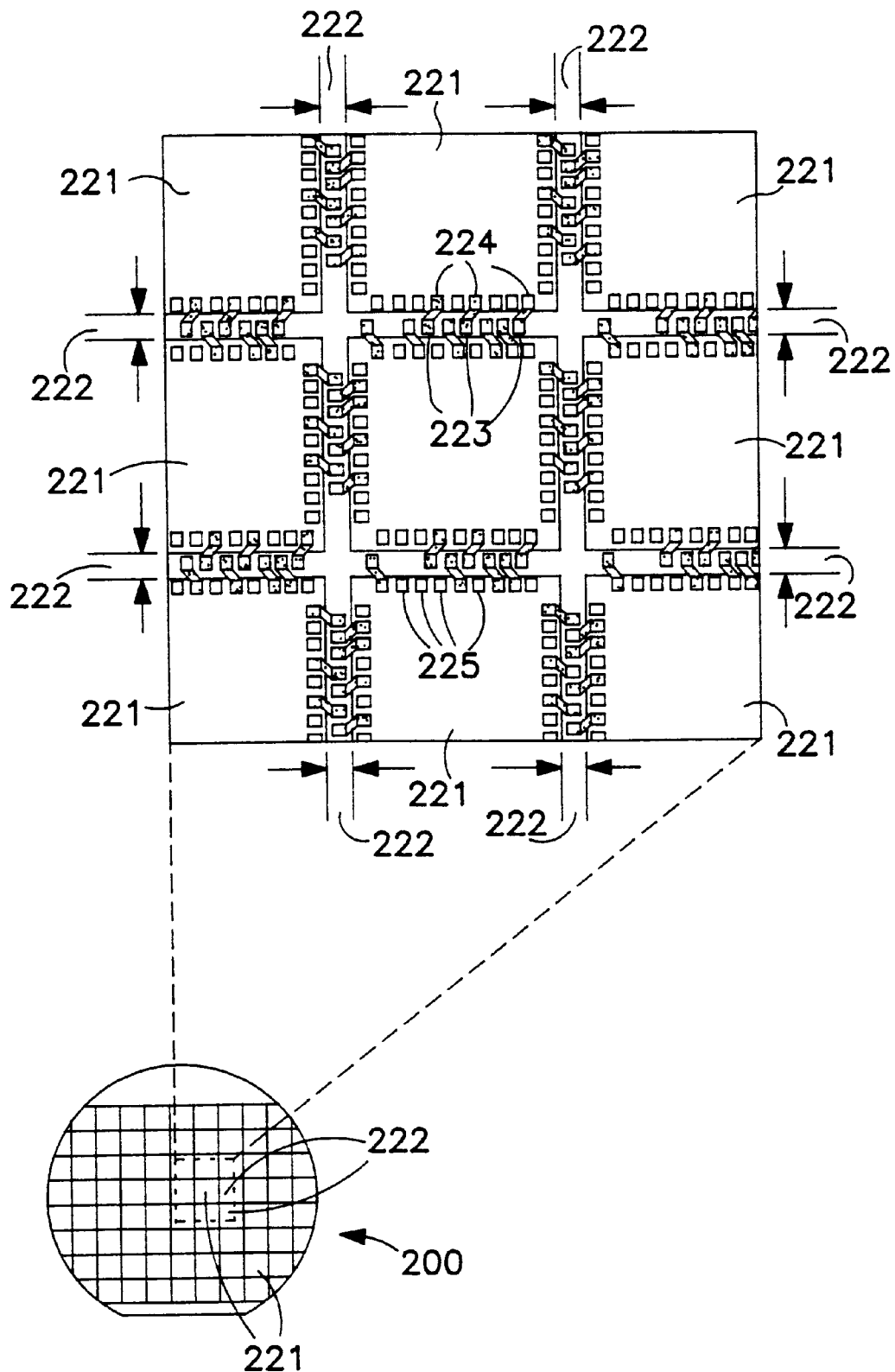
FIG. 7 is a plan view illustrating a semiconductor wafer having power supply pads for the probe test and a partially magnified view thereof according to a second embodiment of the present invention.

Next, a semiconductor wafer according to a second embodiment of the present invention will be described with reference to the drawings. FIG. 7 is a plan view illustrating a semiconductor wafer 200 according to the second embodiment of the present invention.

In the semiconductor wafer 200, a plurality of chip regions 221 are provided on the surface thereof in a matrix formation, and a semiconductor chip is formed in each of these chip regions 221. Neighboring chip regions 221 are mutually separated by a scribe line region 222 which is required when cutting out the semiconductor chip.

As illustrated more clearly in a partially magnified view of the surface of the semiconductor wafer 200, signal pads 225 and power supply pads 224 are formed inside each chip region 221. These pads 224 and 225 are connected to package pads provided on a package when a bare chip is mounted on the package.

On the other hand, additional power supply pads 223 for the probe test are formed in the scribe line region 222, and connected to the power supply pads 224 provided in the chip region 221. As described, when the power supply pads 223 for the probe test are formed in the scribe line region 222, the power supply pads 223 are simultaneously ground away together with the scribe line region 222 when each bare chip is cut out from the semiconductor wafer.

By using the semiconductor wafer 200 of this embodiment, the operational test for the semiconductor chip to be fabricated can be conducted, for example, as follows:

First, while forming a prescribed chip pattern on the semiconductor wafer, the power supply pads for the probe test are formed in the scribe line region in the same process. Then, the probe test is performed using the thus formed power supply pads 223 so as to check whether or not the thus formed semiconductor chip operates normally in a desired manner and distinguishes good samples and failed samples. Thereafter, dicing of the semiconductor wafer is performed so that each chip region 221 is separated from each other along the scribe line region 222, and fabricate the final products using the selected good samples. The power supply pads 223 in the scribe line region 222 can be arranged such that GND pads and/or Vcc pads are used commonly for the adjacent semiconductor chips.

As explained in connection with the first embodiment, the semiconductor chips can be mounted in various ways. The chips can be packaged using wire bonding connections, or can be fabricated into a module in which a bare chip is mounted with, for example, a flip chip technique on a printed circuit board. It is further possible to obtain an MCM. In any case, only good samples exhibiting desired function can be selected to form a final product, since the final stage of operation tests has been already done with the wafer. Thus, production yield increases.

Figure 8:
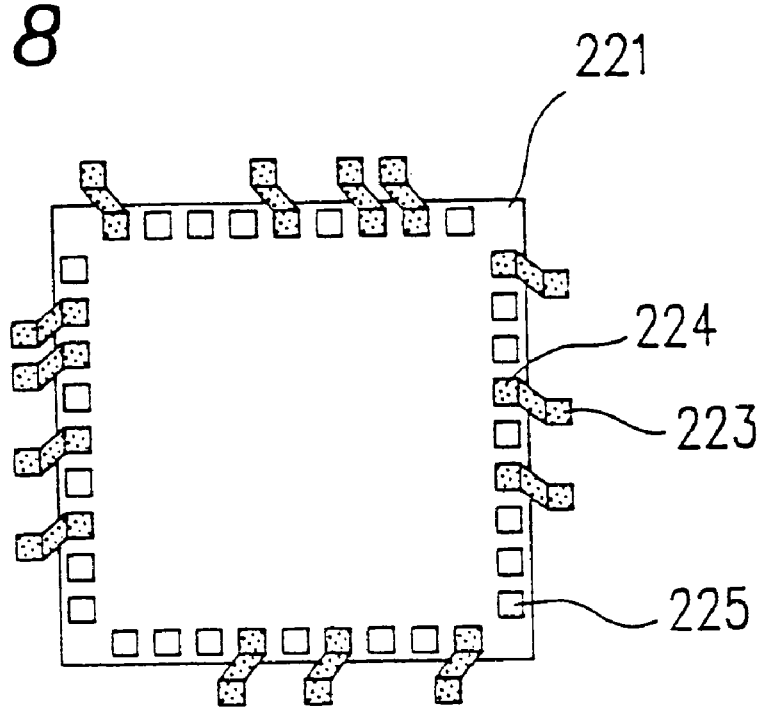
FIG. 8 is a plan view illustrating the arrangement of the pads in one chip region when the probe test is conducted on the semiconductor wafer illustrated in FIG. 7.

FIG. 8 schematically shows a distribution of pads in the chip region 221 when the probe test is conducted on the semiconductor wafer. Each pad is arranged such that the power supply pads 223 for the probe test are positioned in a single line in the scribe line region (i.e., outside of the chip region 221).

Figure 9:
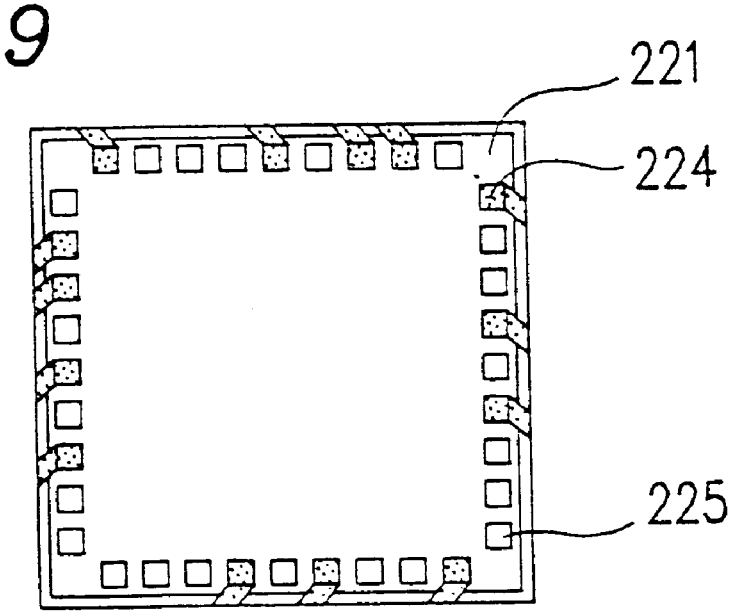
FIG. 9 is a plan view illustrating one chip region after respective chip regions are cut at a scribe line region after the probe test is conducted on the semiconductor wafer illustrated in FIG. 7.

On the other hand, FIG. 9 illustrates one chip region 221 after the respective chip regions 221 are cut into individual pieces along the scribe line region after the probe test is over. The power supply pads for the probe test have been ground away, leaving a portion of the connecting wirings to the power supply pads 224 provided inside the chip region 221.

As described, by utilizing the scribe line region 222 for positioning the pads, the power supply pads 223 for the probe test can be positioned without increasing the area of a bare chip which is used in a final product, and it becomes possible to conduct a high speed operation test during the probe test on the wafer without bringing about the increase in the chip area.

Figure 10:
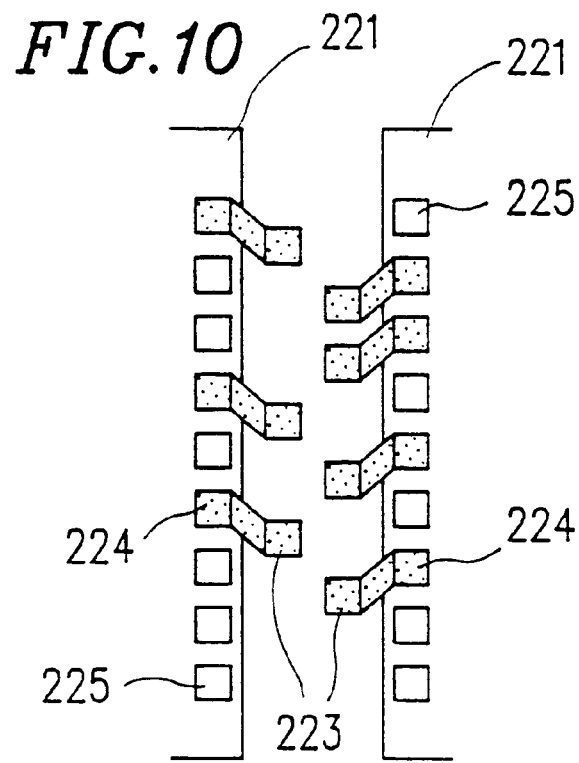
FIG. 10 is a plan view schematically illustrating another arrangement of the power supply pads for the probe test provided in the scribe line region according to the second embodiment of the present invention.
Figure 11:
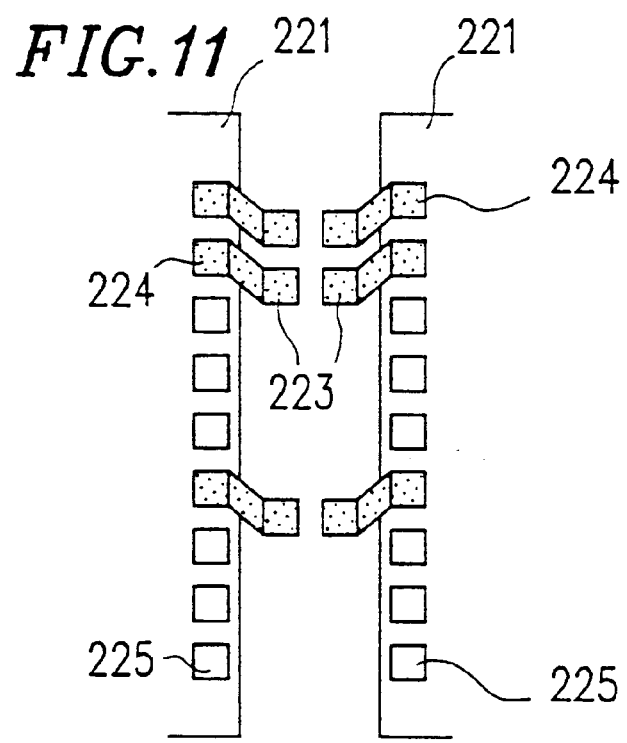
FIG. 11 is a plan view schematically illustrating still another arrangement of the power supply pads for the probe test provided in the scribe line region according to the second embodiment of the present invention.
Figure 12A:
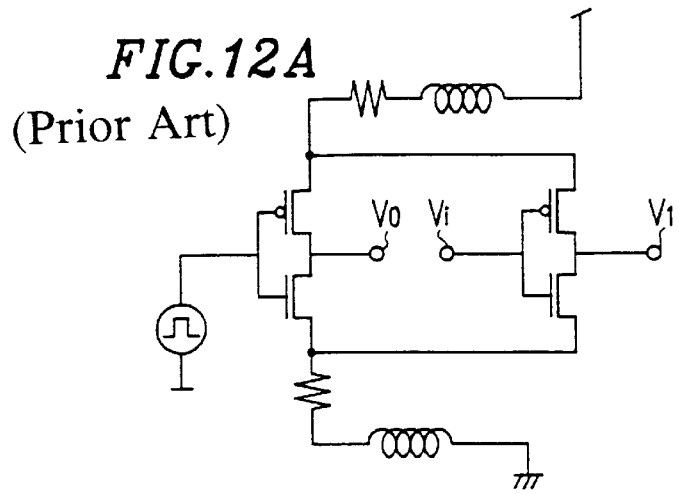
FIG. 12A shows one example of a conventional circuit configuration of output pad to be included in a semiconductor chip.
Figure 12B:
FIG. 12B shows a conventional waveform illustrating an example of a voltage fluctuation in an output voltage caused by the ground bounce phenomenon in the circuit shown in FIG. 12A.
Figure 12C:
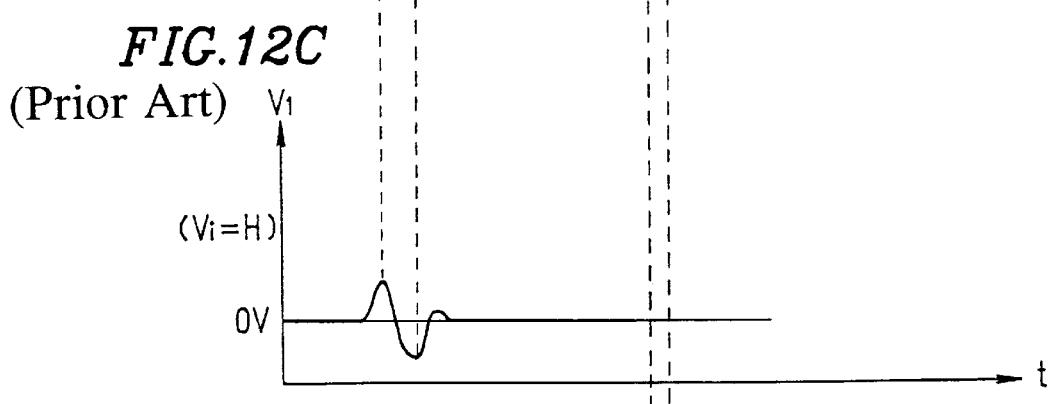
FIG. 12C shows an exemplary conventional voltage fluctuation caused by the ground bounce phenomenon, which is observed at an output pin which outputs a constant low level.
Figure 12D:
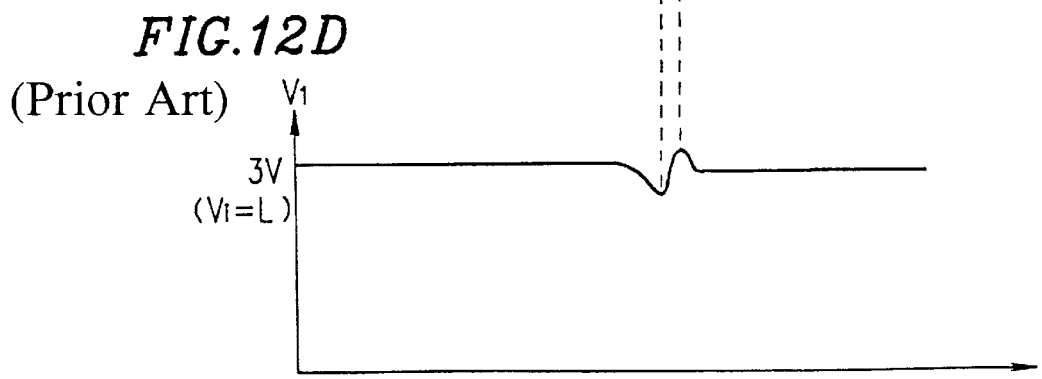
FIG. 12D shows an exemplary voltage fluctuation caused by the ground bounce phenomenon, which is observed at an output pin which outputs a constant high level.

In the above description of the second embodiment, the power supply pads 223 for the probe test which are positioned in the scribe line region 222 are arranged in a single line. However, the arrangement of these power supply pads 223 is not limited to this. They can be arranged in a staggered manner as shown in FIG. 10, or in multiple lines as shown in FIG. 11. A similar effect can be obtained in these cases.

Even in the case where the power supply pads 223 for the probe test are provided in the scribe line region 222, some of the power supply pads 223 may be further provided in the pad region or in the internal circuit region inside the chip region 221.

As described above, the semiconductor chip of the present invention is equipped with the additional power supply pads (the second group of power supply pads) which are used only during the probe test of the wafer in addition to the original power supply pads (the first group of power supply pads) which are used in a final product. This makes it possible to effectively reduce the influence of the power supply noise during the probe test of the wafer as well as to conduct a test at the maximum operation frequency on the bare chip. As a result, the overall efficiency of the operation test for the semiconductor chips improves, while manufacturing cost is reduced.

Furthermore, when the second group of power supply pads provided for the probe test are positioned in the scribe line region on the semiconductor wafer, the second group of power supply pads are ground away together with the scribe line region in the step of cutting individual bare chips from the semiconductor wafer after the completion of the test. Therefore, the above described effect can be obtained without bringing about the increase in the area of the semiconductor chip as a final product or a major layout change.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor chip, the method comprising the steps of:

forming, in a chip region on a semiconductor wafer, a pattern of the semiconductor chip at least including an internal circuit providing a first function, a signal pad connected to the internal circuit and configured for at least one of providing a signal to the internal circuit and receiving a signal from the internal circuit, and a first power supply pad connected to the internal circuit and configured for supplying electric power to the internal circuit both in a mounted condition for operation and in an operational test with a probe;

forming at least one second power supply pad, connected to the internal circuit in a parallel configuration with the first power supply pad and configured for supplying electric power to the internal circuit only in the operational test with the probe, in a scribe line region on a surface of the semiconductor wafer;

conducting the operational test with the probe to check whether the semiconductor chip provides a second function or not, using both the first power supply pad and the second power supply pad; and cutting the semiconductor chip from the semiconductor wafer along the scribe line region and removing the second power supply pad provided in the scribe line region.

2. A method for fabricating a semiconductor chip according to claim 1, wherein the pattern of the semiconductor chip and the second power supply pad are formed in the same process.

3. A method for fabricating a semiconductor chip according to claim 1, wherein the second power supply pad is formed in the scribe line region to be arranged in one line.

4. A method for fabricating a semiconductor chip according to claim 1, wherein the second power supply pad is formed in the scribe line region to be arranged in multiple lines.

5. A method for fabricating a semiconductor chip according to claim 1, wherein the second power supply pad is formed in the scribe line region to be arranged in a staggered manner.

6. A method for fabricating a semiconductor chip according to claim 1, wherein the second power supply pad is further formed in the chip region.

7. A method for fabricating a semiconductor chip according to claim 1, wherein the operational test with the probe is conducted prior to separation of the semiconductor chip from the semiconductor wafer.

8. A method for fabricating a semiconductor chip according to claim 1, further comprising the step of packaging the semiconductor chip which is selected based on a result of the operational test.

9. A method for fabricating a semiconductor chip according to claim 1, further comprising the step of conducting a mounting process for the semiconductor chip which is selected based on a result of the operational test.

10. A method for fabricating a semiconductor chip according to claim 1, further comprising the step of conducting a mounting process for the semiconductor chip, as a bare chip, which is selected based on a result of the operational test.

11. A method for fabricating a semiconductor chip according to claim 1, further comprising the step of conducting a mounting process for a plurality of the semiconductor chips selected based on a result of the operational test to form a multi-chip module.

12. A method for fabricating a semiconductor chip, the method comprising the steps of:

forming, on a semiconductor wafer, a pattern of the semiconductor chip at least including an internal circuit providing a first function, a signal pad connected to the internal circuit and configured for at least one of providing a signal to the internal circuit and receiving a signal from the internal circuit, a first power supply pad connected to the internal circuit and configured for supplying electric power to the internal circuit both in a mounted condition for operation and in an operational test with a probe, and a second power supply pad connected to the internal circuit in a parallel configuration with the first power supply pad and configured for supplying electric power to the internal circuit only in the operational test with the probe; and conducting the operational test with the probe to check whether the semiconductor chip provides a second function or not, using both the first power supply pad and the second power supply pad.

13. A method for fabricating a semiconductor chip according to claim 12, further comprising the step of separating the semiconductor chip from the semiconductor wafer.

14. A method for fabricating a semiconductor chip according to claim 12, wherein the pattern of the semiconductor chip and the second power supply pad are formed in the same process.

15. A method for fabricating a semiconductor chip according to claim 12, wherein the internal circuit is provided in an internal circuit region, the signal pad and the first power supply pad are formed in a pad region, and at least one of the second power supply pad is provided in the pad region.

16. A method for fabricating a semiconductor chip according to claim 12, wherein the internal circuit is provided in an internal circuit region, the signal pad and the first power supply pad are formed in a pad region, and at least one of the second power supply pad is provided in the internal circuit region.

17. A method for fabricating a semiconductor chip according to claim 12, wherein the operational test with the probe is conducted prior to separation of the semiconductor chip from the semiconductor wafer.

18. A method for fabricating a semiconductor chip according to claim 12, further comprising the step of packaging the semiconductor chip which is selected based on a result of the operational test.

19. A method for fabricating a semiconductor chip according to claim 12, further comprising the step of conducting a mounting process for the semiconductor chip which is selected based on a result of the operational test.

20. A method for fabricating a semiconductor chip according to claim 12, further comprising the step of conducting a mounting process for the semiconductor chip, as a bare chip, which is selected based on a result of the operational test.

21. A method for fabricating a semiconductor chip according to claim 12, further comprising the step of conducting a mounting process for a plurality of the semiconductor chips selected based on a result of the operational test to form a multi-chip module.

* * * * *